United States Patent [19]

Karg

[11] Patent Number: 5,137,835
[45] Date of Patent: Aug. 11, 1992

[54] METHOD FOR MANUFACTURING A CHALCOPYRITE SOLAR CELL

[75] Inventor: Franz Karg, Munich, Fed. Rep. of Germany

[73] Assignee: Siemens Aktiengesellschaft, Munich, Fed. Rep. of Germany

[21] Appl. No.: 685,283

[22] Filed: Apr. 15, 1991

[30] Foreign Application Priority Data

Jul. 24, 1990 [DE] Fed. Rep. of Germany ....... 4023510

[51] Int. Cl.$^5$ ...................... H01L 31/18; H01L 31/00
[52] U.S. Cl. ............................................ 437/5; 437/3; 136/265
[58] Field of Search .............................. 437/2, 3, 4, 5; 136/258, 265, 260

[56] References Cited

U.S. PATENT DOCUMENTS

| 4,089,713 | 5/1978 | Johnson | 437/3 |
| 4,386,142 | 5/1983 | Hodes et al. | 136/260 |
| 4,536,260 | 8/1985 | Cocivera | 136/260 |
| 4,642,140 | 2/1987 | Noufi et al. | 136/260 |
| 5,078,804 | 1/1992 | Chen et al. | 437/5 |

OTHER PUBLICATIONS

K. Mitchell et al., "Single and Tandem Junction CuInSe$_2$ cell and Module Technology", *IEEE*, 1988, pp. 1384–1389.

*Primary Examiner*—Brian E. Hearn
*Assistant Examiner*—Linda J. Fleck
*Attorney, Agent, or Firm*—Hill, Van Santen, Steadman & Simpson

[57] ABSTRACT

A method for producing a solar cell having a semiconductor layer of copper gallium diselenide covered with a window layer of copper aluminum diselenide by first producing a semiconductor material of one type of conductivity by forming either a copper gallium diselenide or a copper aluminum diselenide and then exchanging metal ions in the upper portion of the layer to provide an opposite type of conductivity by exchanging metal ions of the layer for another type. The exchange can include exchanging both the copper and gallium ions with the zinc ion to form a zinc diselenide window or replacing the gallium ions with aluminum ions to form a copper aluminum diselenide window or, if a copper aluminum diselenide layer had been provided, forming an absorbing layer by replacing the aluminum ions with the gallium ions to form the absorbing layer.

12 Claims, 1 Drawing Sheet

METHOD FOR MANUFACTURING A CHALCOPYRITE SOLAR CELL

BACKGROUND OF THE INVENTION

The present invention is directed to a method for manufacturing a chalcopyrite solar cell.

A conversion of light into electrical power with solar cells must become decisively cheaper in order to complete with conventional methods of power generation. In addition, high-efficiency solar cells having an efficiency of at least 15% are required in order to limit the relatively high surface area requirements for the exploitation of solar energy.

Conventional solar cells are usually composed of monocrystalline or polycrystalline silicon and, recently, also include amorphous silicon to an increasing degree. However, these types of solar cells have many disadvantages. For example, solar cells of a crystalling or polycrystalling silicon are expensive to manufacture and solar cells using the amorphous silicon have an inadequate stability and have not yet achieved an adequate efficiency.

What is referred to as chalcopyrite solar cells whose crux is formed by an absorber layer having a I-II-VI$_2$ compound semiconductor are the subject matter of recent investigations. A functional solar cell is obtained in combination with a suitable window layer composed of a lattice-matched semiconductor material as the emitter and surface passivation layer.

A solar cell having a copper indium diselenide (CIS) as an absorber is disclosed in an article by K. Mitchell et al, "Single and Tandem Junction CuInSe$_2$ Cell and Module Technology", *IEEE*, 1988, pp. 1384–1389. The semiconductor layer is applied in a polycrystallling form on a glass substrate coated with molybdenum as a back side electrode. A thin, n-conductive cadmium sulfide layer is applied over this p-conductive CIS layer and serves as an electron emitter and a zinc oxide layer serves as a transparent electrode. A grid conducts the current generated with this hitherto highest efficiency of 14.1% out of the cell.

A great problem in the manufacture of a chalcopyrite solar cell is to find a material suitable as a window layer. In order to produce the junction between the absorber and the window layer that has only few traps, high demands are made on the physical properties of the window material, whose crystal lattice constant cannot deviate from the one of the absorber by more than 1. The element cadmium in the window layer presents additional problems including environmental incompatibility thereof and requires special safety precautions during production, employment and disposal of the solar cells. Moreover, the indium constituent in the known CIS cell, which have the hitherto highest efficiency, is a relatively rare element so that bottlenecks in terms of material and an increase in price can be anticipated, given expansion of the production of these types of cells.

SUMMARY OF THE INVENTION

It is an object of the present invention to provide a method for the manufacture of a chalcopyrite solar cell that will lead to a cell structure having a good lattice matching and that eliminates disadvantages of utilizing elements of cadmium and indium.

These objects are inventively achieved by a method for manufacturing, a chalcopyrite solar cell having a p-conductive copper gallium diselenide layer as an adsorber and having an n-conductive window layer which comprises the following method steps:

producing a first electrode layer on an electrically insulating substrate:;

producing a semiconductor layer of the chalcopyrite material that is selected from a group consisting of copper gallium diselenide and copper aluminum diselenide and has a first conductivity type;

treating the semiconductor layer with an aqueous solution that contains metal ions, wherein the semiconductor material of the opposite, second conductive type is produced by an ion exchange in an upper layer region and a heterojunction betweeen the one layer region forming the copper gallium diselenide absorber layer and the other layer region forming the window layer will occur: and producing a second electrode layer on the surface of the semiconductor layer.

In the method of the invention, an absorber layer and a window layer are produced in one step in the form of a uniform and homogeneous semiconductor layer. A semiconductor material is thereby obtained which has few traps and which, therefore, has good electronic quality. Compared to a separate production of an absorber layer and a window layer from different materials, additional apparatus costs for producing the second semiconductor layer are eliminated. Instead, the measure of ion exchange replaces this in the method of the invention and is capable of being implemented simply and with little technological outlay. Additional time and money are, thus, saved.

The materials of the semiconductor layer is chemically modified in the upper layer region by an exchange of cations, whereby either a window layer can be produced by introduction of a suitable cation in a relatively thin layer region or the absorber layer as well, can be produced by introduction of suitable, other cations in a relatively thick region. In the first instance, one proceeds on the basis of a semiconductor layer of copper gallium diselenide which, has a high absorption constant in the visual range with a band gap of 1.68 eV and is, therefore, especially well-suited as an absorber material in solar cells. A suitable window layer for this is represented, for example, by a copper aluminum diselenide, which can be obtained in the method of the present invention by exchanging or replacing the gallium ions with aluminum ions. This designational exchange of one of the two possible cations succeeds by buffering the second cation (Cu+) in the acqueous solution in that the copper ions are offered in a quantity in the solution corresponding to the equilibrium concentration. Zinc selenide, which is likewise well-suited as a window material, can be even more simply obtained by exchanging both the cations of the copper gallium diselenide with zinc ($Zn^{2+}$).

In the alternative, a second embodiment of the invention, the semiconductor layer is produced from a material suitable for the window layer. Proceeding on this basis, a layer of copper aluminum diselenide ($CuAlSe_2$) is applied. An upper layer region that is relatively thick this time is subsequently converted to a copper gallium diselenide by exchanging and replacing the aluminum ions with gallium ions and the absorber layer is, thus, produced. This step also requires the buffering of the copper ions in the ion exchange solution in order to prevent the exchange of copper in the semiconductor layer.

The identical crystal lattice of the semiconductor materials employed in this method of the invention for both the absorber layer and the window layer guarantees that the crystal lattice of the semiconductor layer remains unaltered in the upper layer region during the ion exchange. No additonal traps that could represent possible recombination centers for charge carrier pairs can, therefore, occur. The quality of the semiconductor junction (the heterojunction), which is formed at the boundary surface between the upper and lower layer regions, is thus, only dependent on the quality of the semiconductor layer that is first produced.

The method of ion exchange itself can be simple and quickly implemented and can be extremely well controlled. The "new" ions to be exchanged are presented in an adequate concentration in an aqueous solution in which the exchange occurs at elevated temperatures by, for example, immersion of the semiconductor layer. Given a corresponding semiconductor layer of a thickness of approximately 1–5$\mu$m, the desired exchange is obtained within a few minutes with the solution heated, for example, to 70° C. Higher temperatures and higher ion concentrations of the solution will accelerate the rate of exchange. The depth of the layer region within which the exchange of the cations occurs can be set, for example, by the duration of the treatment. In order to obtain a thin layer region of which "old" and "new" ions form a mixed phase can, thereby, be observed in the region of the junction is of no significance for the quality of the semiconductor junction.

The thickness of the absorber layer is dimensioned so that the incident sunlight is completely absorbed therein. A layer thickness of 1–2$\mu$m for the copper gallium diselenide layer are adequate for this purpose. A decrease in the efficiency of the solar cell constructed thereof is observed, beginning with a layer of thickness that goes beyond this optimum thickness range. The material of the window layer exhibits only slight absorption of the visible light, since it has a band gap of about 2.5 eV, for example 2.7 eV for copper aluminum diselenide. The window layer is fashioned ooptimally thin and amounts, for example, to 1%–50% of the overall thickness of the semiconductor layer. However it should be at least of a thickness that can absorb that part of the space charge zone devolving onto the window layer. For example, a typical thickness that corresponds to the length of the space charge zone is in the window layer, approximately 20–100 nm.

The two fundamental alternatives on which the method of the present invention is based produce two different types of solar cells. When the semiconductor layer is first constructed of a window material, then a transparent substrate having a transparent first electrode layer must be utilized. The light incidence given this so-called superstate cell will then occur through the substrate, transparent first electrode layer and window layer into the absorber layer. The second alternate construction leads to what is referred to as a substrate cell that can be constructed on a non-transparent substrate with a normal, usually metallic, first electrode layer. The light incidence thereby occurs through the second electrode layer that is executed to be transparent in this case and through the window layer into the absorber layer.

Other advantages and features of the invention will be readily apparent from the following description of the preferred embodiments, the drawings and claims.

DESCRIPTION OF THE PREFERRED EMBODIMENTS

Figure 1:
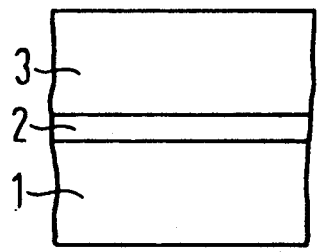
FIGS. 1–3 are schematic cross sectional views showing various method stages during constructions of a solar cell invention in a superstrate arrangement.
Figure 3:
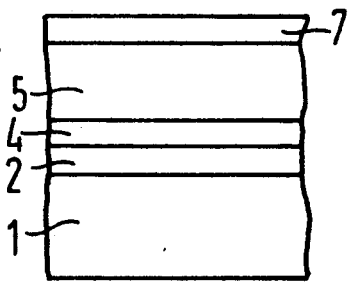

The principles of the present invention are particularly useful when producing a solar cell and a superstrate arrangement, such as illustrated in FIG. 3. To produce this cell, a glass plate 1 (FIG. 1) is provided as a substrate. This glass plate is coated with a thin layer 2 of a transparent conductor (TCO), for example with a fluorine-doped stannous oxide ($SnO_2$:F). The materials for this first electrode layer and substrate 1 have a minimum absorption for visible light so that they are well-suited for a solar cell illuminated through the substrate 1.

Proven technologies are available for producing a semiconductor layer 3. These technologies have been already successfully employed for producing coppper indium diselenide (CIS). In the present case, the semiconductor layer is produced from window material of polycrystalline copper aluminum diselenide ($CuAlSe_2$). This is preferably by sputtering metallic layers of copper and aluminum on the substrate, these layers are then tempered approximately in a range of 400° C. to 200° C. atmosphere that contains hydrogen selenide. Under these conditions. the metallic copper and aluminum layers are converted into a ternary compund of copper aluminum diselenide. A homogenous, polycrystalline semiconductor layer 3 having a thickness of 1–5$\mu$m, but preferably in a range of 1–2$\mu$m will then occur. In the alternative method for producing the semiconductor layer 3, the sputtering of copper and aluminum layers can be replaced by a vapor-dsposition and the selenization in a hydrogen selenide atmosphere can be replaced by a vapor-deposition of elementary selenium and a subsequent anneal in an inert gas atmosphere. An advantage of sputtering of the layers is that the method is suitable for larger substrate areas. With the completion of the formation of the semiconductor layer 3, one will have the arrngement of FIG. 1.

Figure 2:
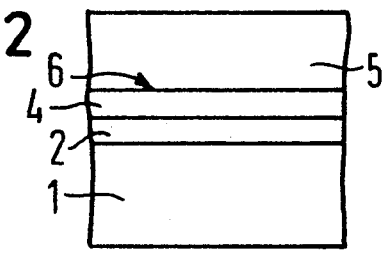

The material of the semiconductor layer 3 is a window material that has a band gap of 2.7 eV. One part of this semiconductor layer, namely the upper layer region 5 (see FIG.2), is then coverted into a copper gallium diselenide. To that end, the copper aluminum diselenide layer is immersed into an aqueous solution that contains gallium ions and that is held at a temperature in a range of 20° C.–100° C. In addition to the highly concentrated gallium ions, the solution also contains copper ions in an equipibrium concentation. Since copper aluminum diselenide and copper gallium diselenide have identical crystal lattices, the ion exchange or replacement of aluminum by gallium occurs rapidly and is only dependent on the temperature of the solution. The extent of the ion exchange or, respectively, the thickness of the ion-exchanged, upper layer region 5 is dimensioned according to the electrical conductivity of the window material ($CuAlSe_2$) and can amount in a range of 50% to 99% of the overall layer thickness of the semiconductor layer 3. Layers having poor electrical conductivity are advantageously executed to be thinner. The desired thickness is set with the parameters of temperature and the chronological duration of the ion exchange prosess. A temperature in the solution of 90° C. and a duration of a maximum of 10 minutes are typical for this process. At the end of the exchange, an arrangement having an upper layer region 5 of the former semiconductor layer 3 will be converted to the copper gallium diselenide, as illustrated in FIG. 2 by the layer 5. Due to different electron conductivity of the unmodified window material in the lower layer region 4 in comparison to the p-conductive absorber material of the upper region 5, a heterojunction 6 around which a space charge zone is formed will occur at the boundary beween the two layer regions 4 and 5.

As a last step that leads to the completion of the solar cell, a suitable second electrode layer 7, for example a second electrode layer 7 that is highly conductive, reflective and does not diffuse into the semiconductor layer, is produced. This represents the back electrode of the solar cell. A suitable metal that satisfies these conditions and also has good adhesion to copper gallium diselenide is molybdenum. After applying this second electrode layer 7, one obtains the solar cell, which is shown schematically in FIG. 3.

Figure 4:
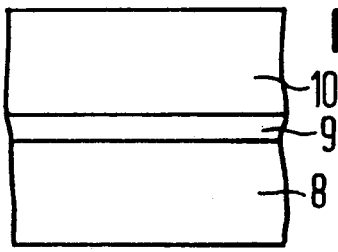
FIGS. 4–6 are schematic cross sectional views showing various method stages in the manufacture of a solar cell of the invention in a substrate arrangement.
Figure 6:
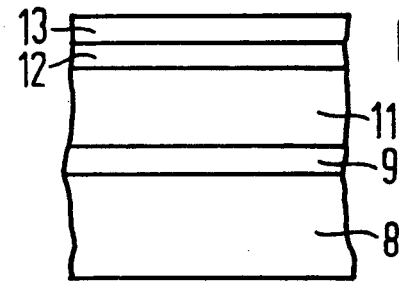

In order to manufacture a substrate arrangement of a chalcopyrite solar cell, such as illustrated in FIG. 6, one follows the following procedure. Such a substrate arrangemetn is suitable for the illumination of a solar cell proceeding from the back side so that a non-transparent substrate 8 can form the base. In the first manufacturing step illustrated in FIG. 4, a first electrode layer 9 of, for example, a highly conductive and highly reflective metal is applied on the electrically insulating substrate 8. Then, a semiconductor layer 10 of copper gallium diselenide having a thickness of 1-5$\mu$ and, preferably a thickness of 1-2 $\mu$m is deposited on the first electrode layer 9. The manufacturing can be, in turn, analogous to the method for manufacturing a CIS or, respectively, analogous to the manufacturing of the copper aluminum diselenide as in the first exemplary embodiment.

Figure 5:
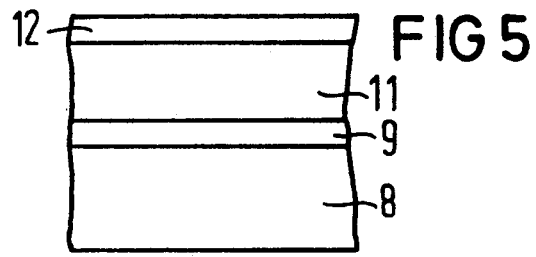

The polycrystalline semiconductor layer 10 that represents a good absorber of 1.68 eV is now converted into a window layer in its upper region 12 (FIG.5) on the basis of an ion exchange. To that end, the ion exchange of the first exemplary embodiment is implementes in an opposite direction and the semoiconductor layer 10 is immersed into a solution containing aluminum ions. A copper aluminum diselenide layer 12 having good polycrystalling quality will be produced by the ion exchange in the upper layer region that amounts to approximately 1% to 50% of the overall thickness of the semiconductor layer 10. At the same time, the band gap in the upper layer region 12 is thereby widened and, thus, the window layer of the solar sell is produced, as illustrated in FIG. 6.

In alternative to this method, the exchange of gallium ion for aluminum ion can also be replaced by an exchange of both cations of the layer 10, such as both the copper and gallium by zinc, wherein a zinc selenide layer in the upper layer region is likewise well-suited as a window material and will produce a semiconductor. This alternative has the advantage that none of the cations need to be buffered and, thus, the setting of an equilibrium concentration can be omitted.

In FIG. 6, a final step for finishing the solar cell is illustrated, wherein a second electrode layer 13 is provided as the upper terminating layer. Since the upper side now represents the light incidence side, a transparent, conductive oxide is utilized for this second electrode layer 13. The realization suceeds, for example, by utilizing a zinc oxide or indium tin oxide (ITO) for the material of layer 13.

All of the illustrated embodiments of the chalcopyrite solar cell of the invention are distinguished by the high quality of the absorber layer, the heterojunction that has few traps, and then for guarantees a high total cell efficiency. By comparison to other known solar cells composed of chalcopyrite materials, the manufacturing method has been greatly simplified. The compounds employed for building the cell are environmentally safe.

Although various minor modifications may be suggested by those versed in the art, it should be understood that I wish to embody within the scope of the patent granted hereon all such modifications as reasonably and properly come within the scope of my contribution to the art.

I claim:

1. A method for manufacturing a chalcopyrite solar cell having a p-conductive copper gallium diselenide layer as an absorber and having an n-conductive window layer, said method comprising the steps of producing a first electrode layer on an electrically insulating substrate; producing a semiconductor layer of a chalcopyrite material that is selected from a group consisting of copper gallium diselenide and copper aluminum diselenide and having a first conductivity type; treating the semiconductor layer with an aqueous solution that contains metal ions, wherein a semiconductor material of an opposite, second conductivity type is produced by an ion exchange in an upper layer region and a heterojunction occurs between one layer region forming the copper gallium diselenide absorber layer and the other region forming a window layer; and producing a second electrode layer on the surface of the semiconductor layer.

2. A method according to claim 1, wherein the step of producing a semiconductor layer produces a layer of copper gallium diselenide and said step of treating a semiconductor layer converts an upper portion of the semiconductor layer into a copper aluminum diselinide window layer having a relatively thin region.

3. A method according to claim 1, wherein, during the step of treating the semiconductor layer, a trivalent metal ion selected from a group consisting of gallium and aluminum is exchanged and the copper is protected against the exchange by a buffering in the solution containing the metal ions.

4. A method according to claim 3, wherein a glass plate is provided as a substrate having a thin layer of a transparent, conductive oxide as a first electrode layer, a copper aluminum diselenide layer is produced thereon and the upper layer region becomes the absorber layer by replacing the aluminum ions with the gallium ions.

5. A method according to claim 1, wherein the step of producing the semiconductor layer produces a layer of copper gallium diselenide and the step of treating replaces the copper and gallium ions with zinc ions in an ion exchange so that zinc selenide window layer will occur.

6. A method according to claim 1, wherein the step of producing the semiconductor layer includes sputtering metallic copper and an element selected from a group consisting of aluminum and gallium onto the first electrode layer for producing a semiconductor layer and subsequently treating this sputtering layer with a hydrogen selenide at an elevated temperature.

7. A method according to claim 6, wherein, during the ion exchange in the upper layer region of the semiconductor layer, a trivalent metal ion selected from a group consisting of gallium and aluminum is exchanged and the copper is protected against the exchange fy buffering in a solution containing the metal ion.

8. A method according to claim 7, wherein the step of producing the first electrocd layer provides a glass plate as the substrate and applies a thin layer of a transparent, conductive oxide as the first elecytrode layer, said step of producing a semiconductor layer produces a semiconductor layer of copper aluminum diselenide and said step of treating the semiconductor layer replaces aluminum ions in the upper region of the layer with gallium ions.

9. A method according to claim 6, wherein the elevated temperature is in a range of 400° C. to 500° C.

10. A method according to claim 9, wherein, during the step of treating, a trivalent metal ion selected from a gropu consisting of gallium and aluminum in the upper layer region of the semiconductor layer is replaced and the copper is protected agains an exchange by buffering in the solution containing the metal ion.

11. A method according to claim 1, wherein the step of producing the semiconductor layer includes sputtering metallic coppera and gallium onto the first electrode layer to produce the semiconductor layer and subsequently selenizing the sputtered layer by subjecting it to a hydrogen selenide atmosphere at an elevated temperature, and the step of treating the semiconductor layer includes replacing both the copper and gallium ions in the upper layer with zinc ions by an ion exchange to produce a zinc selenide window layer.

12. A method according to claim 11, wherein the temperature during the selenizing step is in a range of 400° C. to 500° C.

* * * * *